(12) United States Patent
Park et al.

(10) Patent No.: US 8,143,610 B2
(45) Date of Patent: Mar. 27, 2012

(54) SEMICONDUCTOR PHASE-CHANGE MEMORY DEVICE

(75) Inventors: Jae-Hyun Park, Yongin-si (KR);
Jae-Hee Oh, Seongnam-si (KR);
Sung-Ho Eun, Hwasung (KR)

(73) Assignee: Samsung Electronics Co., Ltd. (KR)

( * ) Notice: Subject to any disclaimer, the term of this patent is extended or adjusted under 35 U.S.C. 154(b) by 302 days.

(21) Appl. No.: 12/653,428

(22) Filed: Dec. 14, 2009

(65) Prior Publication Data
US 2010/0171090 A1    Jul. 8, 2010

(30) Foreign Application Priority Data
Jan. 5, 2009   (KR) .................. 10-2009-0000436

(51) Int. Cl.
| H01L 47/00 | (2006.01) |
| H01L 29/00 | (2006.01) |
| H01L 29/06 | (2006.01) |
| G11C 13/00 | (2006.01) |
| G11C 11/34 | (2006.01) |

(52) U.S. Cl. ............. 257/4; 257/1; 257/5; 257/E45.002; 365/113; 365/163; 365/185.03

(58) Field of Classification Search .................. 257/1, 4, 257/5, E45.002; 365/113, 163, 185.03
See application file for complete search history.

(56) References Cited

U.S. PATENT DOCUMENTS

| 6,750,101 | B2 * | 6/2004 | Lung .............................. 438/257 |
| 7,582,889 | B2 | 9/2009 | Asano |
| 7,625,777 | B2 | 12/2009 | Lee et al. |
| 8,030,635 | B2 * | 10/2011 | Lung et al. ........................ 257/2 |
| 2003/0186481 | A1 * | 10/2003 | Lung .............................. 438/95 |
| 2007/0080421 | A1 | 4/2007 | Lee et al. |
| 2007/0123018 | A1 | 5/2007 | Asano |

FOREIGN PATENT DOCUMENTS
| JP | 2007149913 | 6/2007 |
| KR | 100642645 | 10/2006 |
| KR | 100651756 | 11/2006 |

* cited by examiner

*Primary Examiner* — Long Tran
(74) *Attorney, Agent, or Firm* — Onelle & Mello, LLP

(57) ABSTRACT

A semiconductor phase-change memory device comprises a data line disposed on a semiconductor substrate and a data storage structure disposed under the data line and having a concave portion extending in a direction along the data line. A data contact structure is configured to contact the data storage structure, and having a lower portion filling the concave portion of the data storage structure and an upper portion surrounding at least a lower portion of the data line. Each of sidewalls of the data storage structure is disposed at substantially the same plane as a corresponding one of sidewalls of the upper portion of the data contact structure.

11 Claims, 10 Drawing Sheets

SEMICONDUCTOR PHASE-CHANGE MEMORY DEVICE

CROSS-REFERENCE TO RELATED APPLICATION

This application claims the benefit of Korean Patent Application No. 10-2009-0000436, filed on Jan. 5, 2009, the contents of which are hereby incorporated herein by reference in their entirety.

BACKGROUND

1. Field

Example embodiments relate to a semiconductor phase-change memory device.

2. Description of Related Art

In recent years, semiconductor phase-change memory devices have been fabricated to provide an information storage structure in an insulating layer in a manner that addresses the need for deeper integration of devices having continually smaller design rules. To accomplish this, in a common configuration, the information storage structure is formed to fill an opening defined in an insulating layer. The information storage structure may comprise a phase-change material. Further, the information storage structure may be in contact with a data contact structure, which is formed through a plurality of interlayer insulating layers to provide a transmission channel whereby stored data can be transmitted to a data line. The data contact structure may in turn be in contact with the data line.

It is common for the data contact structure to have multiple conductive patterns with different dimensions. The conductive patterns may be sequentially stacked to be disposed on selected interlayer insulating layers and in the remaining interlayer insulating layers. In this case, each of the conductive patterns may be formed in the corresponding one of the interlayer insulating layers using an one-time semiconductor photolithography process. Thus, the semiconductor photolithography process should be repeated as many times as the number of the conductive patterns, thereby complicating a structure and fabrication method of the semiconductor phase-change memory device.

SUMMARY

Example embodiments provide a semiconductor phase-change memory device appropriate for minimizing the number of times a semiconductor photolithography process is performed.

In one aspect, a semiconductor phase-change memory device comprises a data line disposed on a semiconductor substrate and a data storage structure disposed under the data line and having a concave portion extending in a direction along the data line. A data contact structure is configured to contact the data storage structure, and having a lower portion filling the concave portion of the data storage structure and an upper portion surrounding at least a lower portion of the data line. Each of sidewalls of the data storage structure is disposed at substantially the same plane as a corresponding one of sidewalls of the upper portion of the data contact structure.

In one embodiment, a longitudinal axis of the data storage structure extending in the direction along the data line and a longitudinal axis of the data line are aligned at a central region of the data storage structure.

In another embodiment, the concave portion of the data storage structure is aligned with the longitudinal axis of the data storage structure.

In another embodiment, the lower portion of the data contact structure comprises insulating materials that are sequentially stacked and have different etch rates, and the upper portion of the data contact structure comprises conductive material.

In another embodiment, the lower portion of the data contact structure comprises insulating material and conductive material that are sequentially stacked and have different etch rates, and the upper portion of the data contact structure comprises the conductive material.

In another embodiment, the lower portion of the data contact structure comprises first conductive material and insulating material that are sequentially stacked and have different etch rates, the upper portion of the data contact structure comprises second conductive material, and the first and second conductive materials comprise one of the same material and different materials.

In another embodiment, the lower portion of the data contact structure comprises first conductive material and second conductive material that are sequentially stacked and have different etch rates, the upper portion of the data contact structure comprises the second conductive material, and the first and second conductive materials comprise one of the same material and different materials.

In another embodiment, the device further comprises: an upper insulating layer configured to surround the data line, the data contact structure, and the data storage structure; and a pad electrode disposed under the upper insulating layer in contact with the data storage structure and configured to extend from the sidewalls of the data storage structure, wherein the pad electrode is disposed on the semiconductor substrate along the data storage structure.

In another embodiment, the upper insulating layer comprises at least one insulating material.

In another embodiment, the pad electrode comprises one of the same material as and a different material from the upper portion of the data contact structure.

In another embodiment, the device further comprises: a cell selection stud interposed between the pad electrode and the semiconductor substrate and electrically connected to the data line and the semiconductor substrate; and a lower insulating layer configured to surround the pad electrode and the cell selection stud, wherein the lower insulating layer comprises at least one insulating material, and the cell selection stud comprises at least two conductive materials.

BRIEF DESCRIPTION OF THE DRAWINGS

Example embodiments are described in further detail below with reference to the accompanying drawings. It should be understood that various aspects of the drawings may have been exaggerated for clarity.

DETAILED DESCRIPTION OF THE EMBODIMENTS

Figure 1:
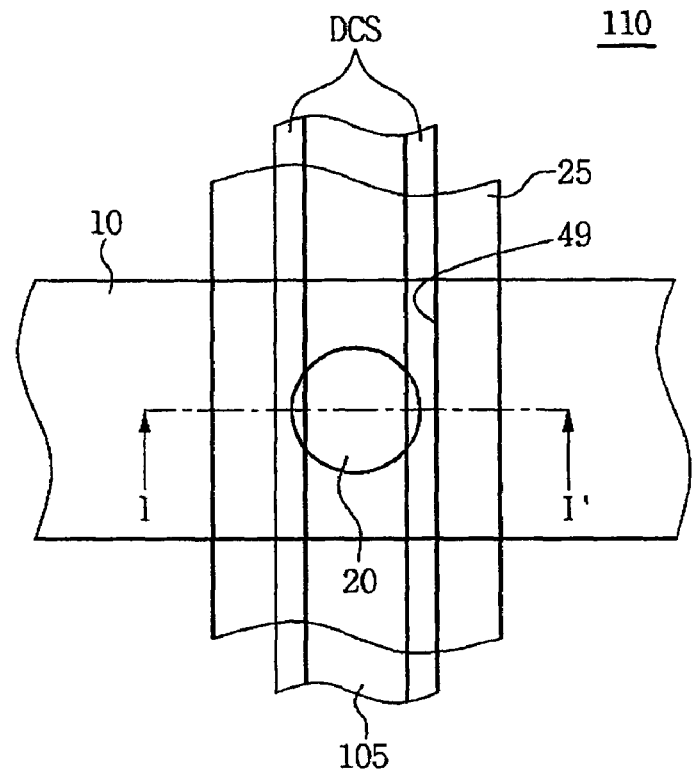
FIG. 1 is a plan view of a semiconductor phase-change memory device according to example embodiments.

Embodiments of the present invention will now be described more fully hereinafter with reference to the accompanying drawings, in which preferred embodiments of the invention are shown. This invention may, however, be embodied in different forms and should not be construed as limited to the embodiments set forth herein. Like numbers refer to like elements throughout the specification.

It will be understood that, although the terms first, second, etc. are used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "on" or "connected" or "coupled" to another element, it can be directly on or connected or coupled to the other element or intervening elements can be present. In contrast, when an element is referred to as being "directly on" or "directly connected" or "directly coupled" to another element, there are no intervening elements present. Other words used to describe the relationship between elements should be interpreted in a like fashion (e.g., "between" versus "directly between," "adjacent" versus "directly adjacent," etc.). When an element is referred to herein as being "over" another element, it can be over or under the other element, and either directly coupled to the other element, or intervening elements may be present, or the elements may be spaced apart by a void or gap. As mentioned above, the drawings are not necessarily to scale, and while certain features in the drawings appear to have rectangular edges that meet at right angles, those features in fact can be oval, contoured, or rounded in shape in the actual devices.

As used herein, term "pattern" may be used to describe the resultant structure that may be obtained while a selected semiconductor fabrication process is being performed on a desired layer in a semiconductor fabrication line. Also, term "structure" may be used to describe a specific object that may be obtained after a selected semiconductor fabrication process is performed on a desired layer. Spatially relative terms, such as "preliminary", "upper", "lower", "selection", "portion", "remaining", "under", "on" and the like, may be used herein for ease of description to describe one element or feature's relationship to another element(s) or feature(s) as illustrated in the figures. The terminology used herein is for the purpose of describing particular embodiments only and is not intended to be limiting of the invention.

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

A semiconductor phase-change memory device according to example embodiments will now be described more fully with reference to FIGS. 1 and 2.

Figure 2:
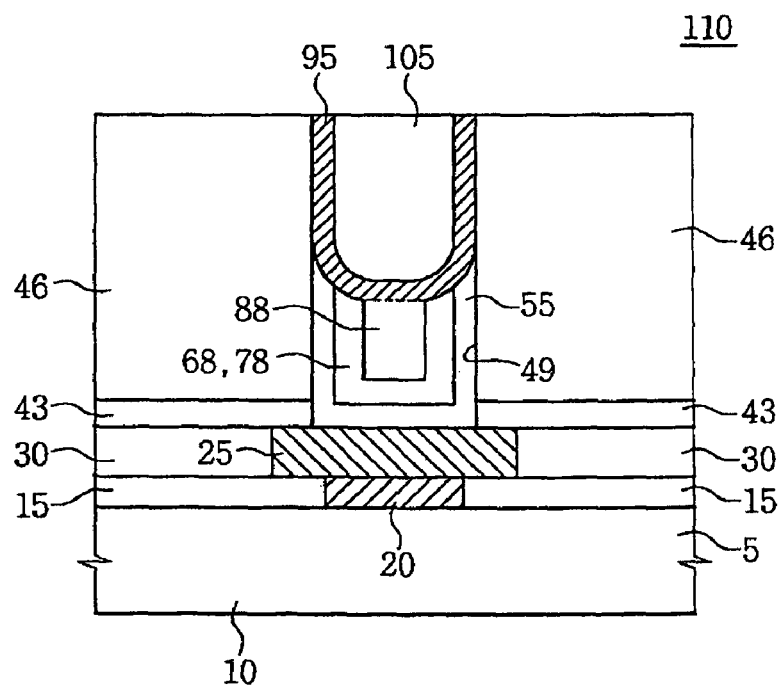
FIG. 2 is a cross-sectional view of a semiconductor phase-change memory device taken along line I-I' of FIG. 1.

FIG. 1 is a plan view of a semiconductor phase-change memory device according to example embodiments, and FIG. 2 is a cross-sectional view of a semiconductor phase-change memory device taken along line I-I' of FIG. 1.

Referring to FIG. 1, a semiconductor phase-change memory device 110 according to example embodiments may comprise a data contact structure DCS on an active region 10. The active region 10 may be disposed to extend in a first direction. The data contact structure DCS may be disposed across the active region 10 to extend in a second direction. A data line 105 may be disposed in a central region of the data contact structure DCS. The data line 105 may be exposed by the data contact structure DCS to make contact with the data contact structure DCS.

The data line 105 may be disposed to extend in the same direction as the data contact structure DCS, in this case, the second direction. A pad electrode 25 may be disposed under the data contact structure DCS and the data line 105. The pad electrode 25 may be disposed in the same direction as the data line 105. The pad electrode 25 may have a greater width in the first direction than the sum of the widths of the data contact structure DCS and the data line 105. A cell selection stud 20 may be disposed under the pad electrode 25.

Referring to FIG. 2, in the semiconductor phase-change memory device 110 according to the example embodiments the data line 105 is positioned on the active region 10. The active region 10 may be disposed in a semiconductor substrate 5. The data line 105 may extend from an upper portion of the active region 10 in an upward, vertical direction.

A data storage structure 55 may be disposed under the data line 105. The data storage structure 55 may have the same center axis in the second direction as the data line 105. The data storage structure 55 may have a concave portion that is oriented to extend along the data line 105. The concave portion of the data storage structure 55 may be disposed in a central region of the data storage structure 55. The concave portion of the data storage structure 55 may not necessarily have the same center as the data storage structure 55.

A protection pattern 68 or 78 and a filing pattern 88 may be sequentially disposed in the concave portion of the data storage structure 55. The protection pattern 68 or 78 may conformably cover the concave portion of the data storage structure 55. The filling pattern 88 may fill the resultant concave portion of the protection pattern 68 or 78 of the data storage structure 55, or alternatively, in another embodiment, is not disposed in the concave portion of the data storage structure 55. Together, the protection pattern 68 or 78 and the filling pattern 88 may constitute a lower portion of the data contact structure DCS of FIG. 1.

A contact pattern 95 may be disposed on the protection pattern 68 or 78 and the filling pattern 88. The contact pattern 95 may contact the data storage structure 55. The contact pattern 95 may surround the data line 105. When the filling pattern 88 is not disposed on the protection pattern 68 or 78, the contact pattern 95 may contact the protection pattern 68 or 78. The contact pattern 95 may constitute an upper portion of the data contact structure DCS of FIG. 1.

Each of sidewalls of the upper portion of the data contact structure DCS may be disposed on substantially the same plane as a corresponding one of the sidewalls of the data storage structure 55. An upper insulating layer 43 and 46 may be provided to surround the data contact structure DCS, the data storage structure 55, and the data line 105. A pad electrode 25 may be disposed under the upper insulating layer 43 and 46. The pad electrode 25 may contact a bottom of the data storage structure 55, and additionally, although not shown, can extend from sidewalls of the data storage structure 55.

The cell selection stud 20 may be disposed under the pad electrode 25. The cell selection stud 20 may contact the active region 10 and the data storage structure 55. Lower insulating layers 15 and 30 may surround the pad electrode 25 and the cell selection stud 20.

Hereinafter, a method of fabricating a semiconductor phase-change memory device according to example embodiments will be described with reference to FIGS. 3 through 19.

FIGS. 3 through 8 are cross-sectional views taken along line I-I' of FIG. 1, which illustrate a method of fabricating a semiconductor phase-change memory device according to example embodiments.

Figure 3:
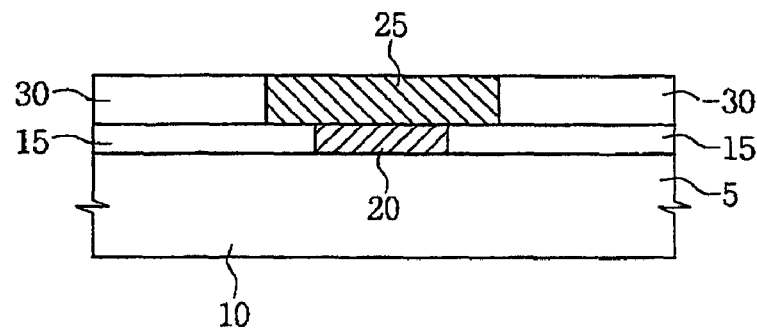
FIGS. 3 through 8 are cross-sectional views taken along line I-I' of FIG. 1, which illustrate a method of fabricating a semiconductor phase-change memory device according to example embodiments.

Referring to FIG. 3, an active region 10 may be formed in a semiconductor substrate 5. The active region 10 may comprise at least one impurity diffusion region. A first insulating layer 15 and a cell selection stud 20 may be sequentially formed on the active region 10. The first insulating layer 15 may be formed to expose the cell selection stud 20. The first insulating layer 15 may comprise insulating material. The cell selection stud 20 may be formed by performing semiconductor deposition and etching processes. Alternatively, the cell selection stud 20 may be formed by performing semiconductor deposition, photolithography, and etching processes.

The cell selection stud 20 may comprise at least two conductive materials. In one embodiment, the cell selection stud 20 may include metal silicide and a diode. A pad electrode 25 may be formed on the cell selection stud 20. The pad electrode 25 may comprise conductive material. In one embodiment, the pad electrode 25 may include metal nitride. The pad electrode 25 may be formed by performing semiconductor deposition and etching processes. Alternatively, the pad electrode 25 may be formed by performing semiconductor deposition, photolithography and etching processes.

A second insulating layer 30 may surround the pad electrode 20. The second insulating layer 30 may comprise insulating material having the same etch rate as, or a different etch rate from, the first insulating layer 15. The first and second insulating layers 15 and 30 may comprise silicon oxide layers or silicon oxide layers doped with impurity ions. The first and second insulating layers 15 and 30 may constitute a lower insulating layer. The lower insulating layers 15 and 30 may be formed by performing a semiconductor deposition process.

Figure 4:
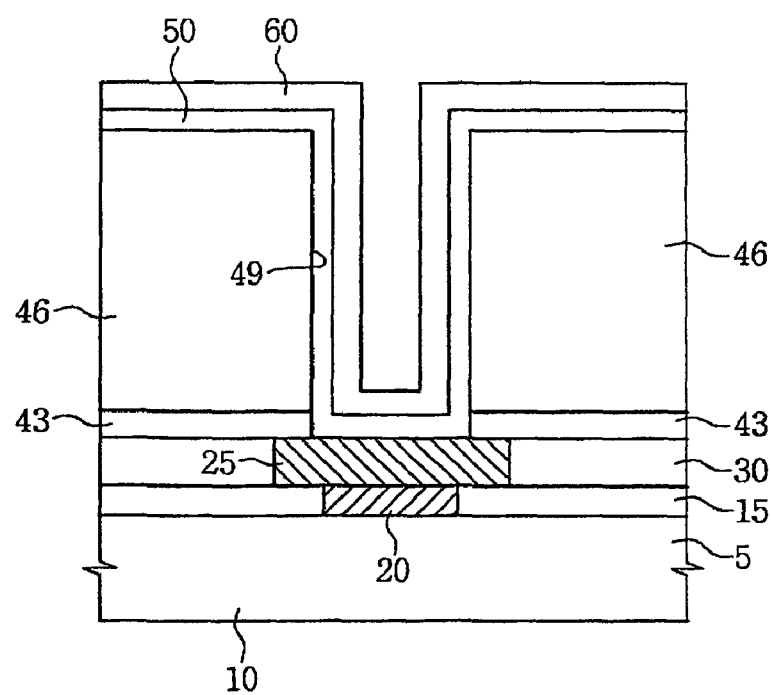
Figure 5:
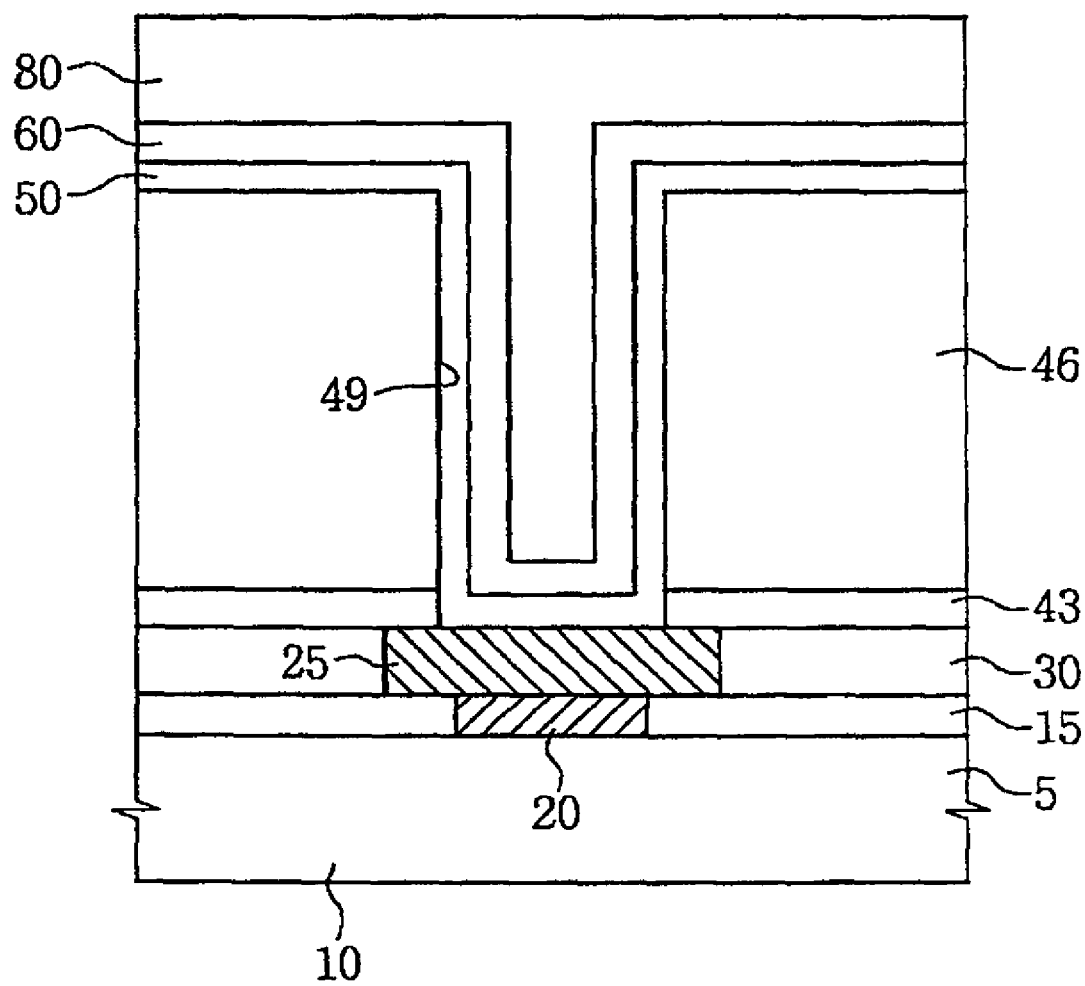

Referring to FIGS. 4 and 5, third and fourth insulating layers 43 and 46 may be sequentially formed on the second insulating layer 30 to cover the pad electrode 25 as shown in FIG. 4. The third insulating layer 43 may comprise an insulating material having a different etch rate from the etch rate of the second and fourth insulating layers 30 and 46. In one embodiment, the third insulating layer 43 may include silicon nitride or silicon oxynitride. The third insulating layer 43 may provide a process margin for a semiconductor etching process. The fourth insulating layer 46 may comprise insulating material having the same etch rate as, or a different etch rate from, the second insulating layer 30.

The fourth insulating layer 46 may comprise insulating material having a high dielectric constant (k>2.5) or a low dielectric constant (k≦2.5). An opening 49 may be formed through the third and fourth insulating layers 43 and 46 as shown in FIG. 4. The opening 49 of the third and fourth insulating layers 43 and 46 may be formed across the active region 10 to extend in the second direction, according to the DCS and the data line 105 as shown in FIG. 1. The opening 49 of the third and fourth insulating layers 43 and 46 may expose the pad electrode 25. The opening 49 of the third and fourth insulating layers 43 and 46 may be formed using semiconductor photolithography and etching processes.

The third and fourth insulating layers 43 and 46 may constitute an upper insulating layer. The upper insulating layer 43 and 46 may be formed by performing a semiconductor deposition process. A phase-change material layer 50 and a protection layer 60 may be sequentially formed on the third and fourth insulating layers 43 and 46 as shown in FIG. 4. The phase-change material layer 50 and the protection layer 60 may be formed to conformably cover the opening 49.

The phase-change material layer 50 may comprise chalcogenide. The protection layer 60 may comprise insulating material having a different etch rate from that of the phase-change material layer 50. The protection layer 60 may comprise silicon nitride. A filling layer 80 may be formed on the protection layer 60 as shown in FIG. 5. The filling layer 80 may be formed on the protection layer 60. The filling layer 80 may fill the opening 49. The filling layer 80 may comprise insulating material having a different etch rate from that of the protection layer 60. The filling layer 80 may be formed by a semiconductor deposition process along with the phase-change material layer 50 and the protection layer 60.

Figure 6:
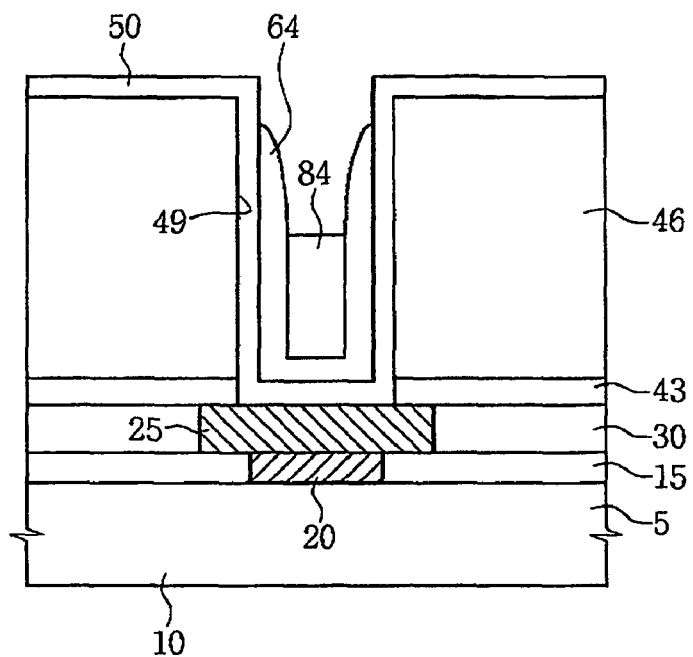

Referring to FIG. 6, the filling layer 80 and the protection layer 60 may be partially removed, thereby forming a preliminary protection pattern 64 and a preliminary filling pattern 84 in the opening 49. The preliminary protection pattern 64 may be formed to partially expose the phase-change material layer 50. The preliminary filling pattern 84 may be formed to partially expose the phase-change material layer 50 and the preliminary protection pattern 64.

The preliminary protection pattern 64 and the preliminary filling pattern 84 may be formed by a semiconductor etching process. The preliminary protection pattern 64 and the preliminary filling pattern 84 may be disposed in a central region of the opening 49 to protect the phase-change material layer 50 at least disposed on a bottom surface of the opening 49.

Figure 7:
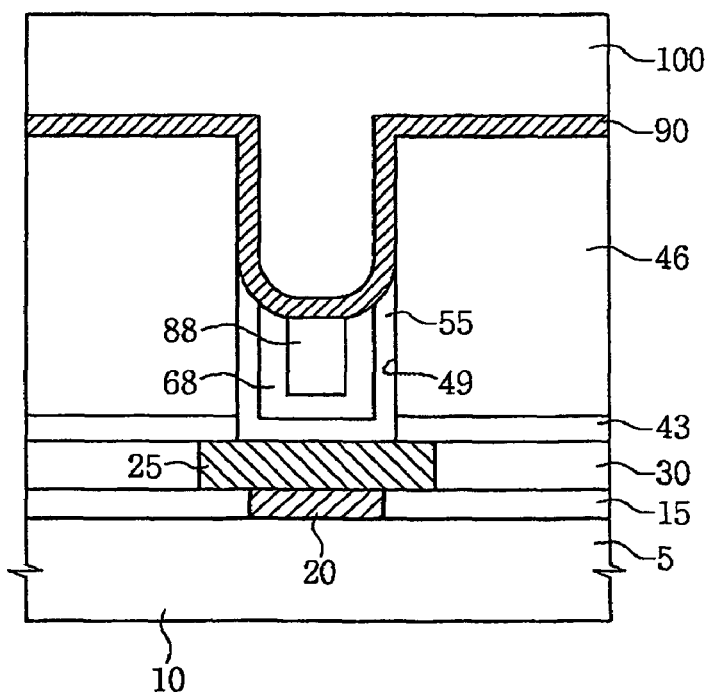

Referring to FIG. 7, the phase-change material layer 50, the preliminary protection pattern 64, and the preliminary filling pattern 84 may be partially removed, thereby forming a data storage structure 55, a protection pattern 68, and a filling pattern 88 in the opening 49. The data storage structure 55, the protection pattern 68, and the filling pattern 88 may be formed by a semiconductor etching process. The data storage structure 55, the protection pattern 68, and the filling pattern 88 may expose a top surface of the upper insulating layer 43 and 46 and an upper sidewall of the opening 49.

In this case, the data storage structure 55 may be formed to have a concave portion. The protection pattern 68 and the filling pattern 88 may be formed to fill the concave portion of the data storage structure 55. A contact layer 90 may be formed to cover the upper insulating layer 43 and 46, the data storage structure 55, the protection pattern 68, and the filling pattern 88. The contact layer 90 may conformably cover the upper sidewall of the opening 49. The contact layer 90 may comprise metal and/or metal nitride.

The contact layer 90 may include at least one material selected from the group consisting of titanium nitride (TiN), titanium/titanium nitride (Ti/TiN), and tantalum nitride (TaN). The contact layer 90 may comprise the same material as, or a different material from that of, the pad electrode 25. A conductive layer 100 may be formed on the contact layer 90. The conductive layer 100 may fill the opening 49. The conductive layer 100 may comprise metal or other suitable conductive material. The conductive layer 100 may include tungsten (W) or copper (Cu). The contact layer 90 and the conductive layer 100 may be formed by a semiconductor deposition process.

Figure 8:
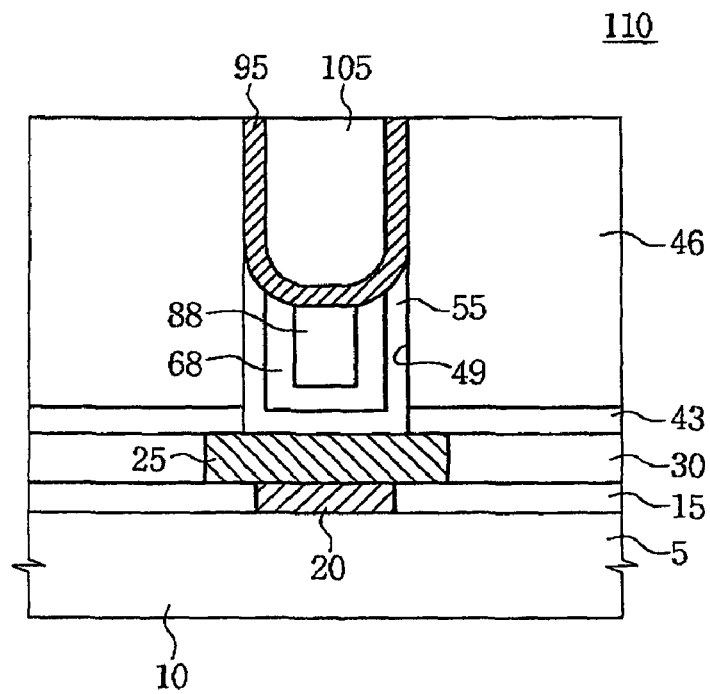

Referring to FIG. 8, the conductive layer 100 and the contact layer 90 may be partially removed, thereby forming a contact pattern 95 and a data line 105. The contact pattern 95 and the data line 105 may be formed by a semiconductor etching process. The contact pattern 95 may constitute the data contact structure DCS along with the protection pattern 68 and the filling pattern 88. Thus, the contact pattern 95 may form an upper portion of the data contact structure DCS, while the protection pattern 68 and the filling pattern 88 may form a lower portion of DCS.

The data line 105 may comprise a bit line that extends in the second direction. The data line 105 may be part of a semiconductor phase-change memory device 110 along with the cell selection stud 20, the pad electrode 25, the data contact structure DCS, and the data storage structure 55.

Figure 9:
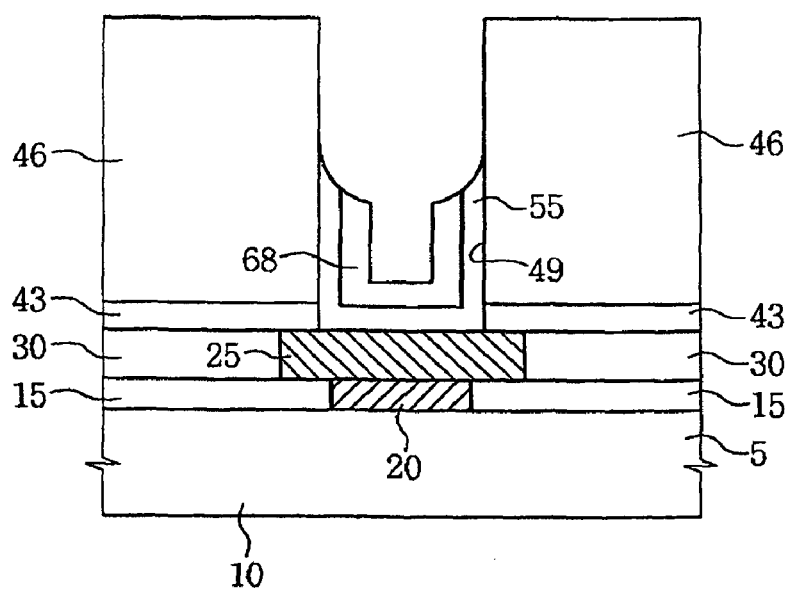
FIGS. 9 through 11 are cross-sectional views taken along line I-I' of FIG. 1, which illustrate a method of fabricating a semiconductor phase-change memory device according to example embodiments.
Figure 10:
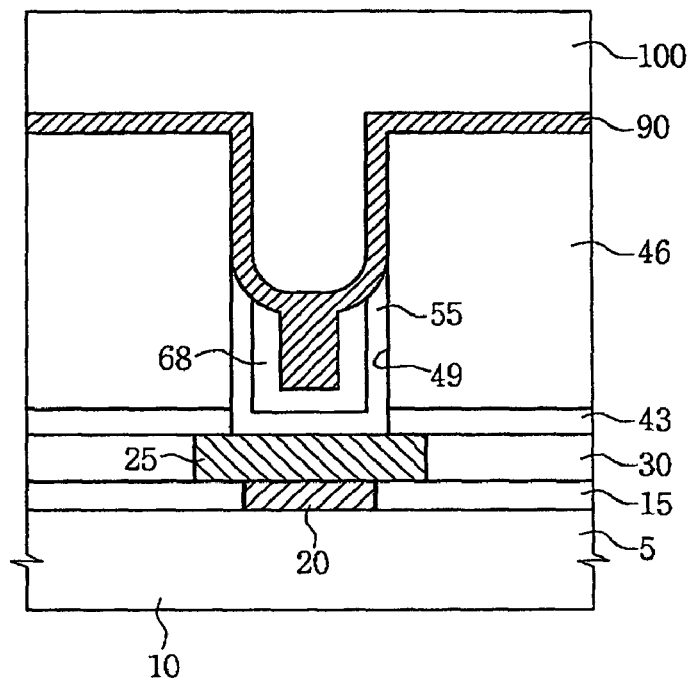
Figure 11:
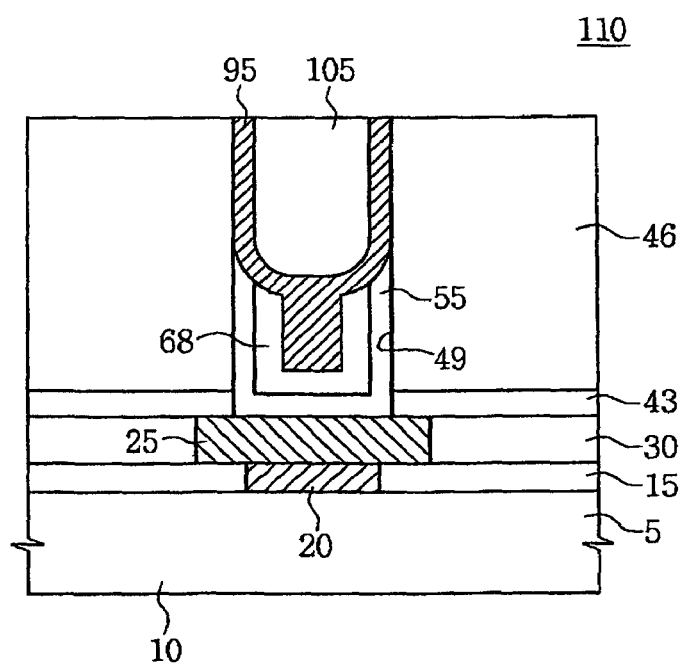

FIGS. 9 through 11 are cross-sectional views taken along line I-I' of FIG. 1, which illustrate a method of fabricating a semiconductor phase-change memory device according to example embodiments. FIGS. 9 through 11 will use the same reference numerals as those of the same elements as FIGS. 3 through 8. Also, processes that will be described below may be performed on the resultant structure shown in FIG. 6.

Referring to FIG. 9, a phase-change material layer 50, a preliminary protection pattern 64, and a preliminary filling pattern 84 may be partially removed, thereby forming a data storage structure 55, a protection pattern 68, and a filling pattern 88 in an opening 49. The data storage structure 55, the protection pattern 68, and the filling pattern 88 may expose a top surface of an upper insulating layer 43 and 46 and expose an upper sidewall of the opening 49. In this case, the data storage structure 55 may be formed to have a concave portion.

The protection pattern 68 and the filling pattern 88 may be formed to fill the concave portion of the data storage structure 55. Thereafter, the filling pattern 88 may be removed using the upper insulating layer 43 and 46, the data storage structure 55, and the protection pattern 68 as an etch buffer layer. The filling pattern 88 may be removed by performing a semiconductor etching process.

Referring to FIG. 10, a contact layer 90 may be formed to cover the upper insulating layer 43 and 46, the data storage structure 55, and the protection pattern 68. The contact layer 90 may conformably cover the upper sidewall of the opening 49. Also, the contact layer 90 may be formed to fill the concave portion of the data storage structure 55. A conductive layer 100 may be formed on the contact layer 90. The conductive layer 100 may be formed to fill the opening 49.

Referring to FIG. 11, the conductive layer 100 and the contact layer 90 may be partially removed, thereby forming a contact pattern 95 and a data line 105. The contact pattern 95 may constitute a data contact structure DCS along with the protection pattern 68. Thus, a portion of the contact pattern 95 may form an upper portion of the data contact structure DCS, while the protection pattern 68 and the remaining portion of the contact pattern 95 may form a lower portion of DCS. The remaining portion of the contact pattern 95 may fill the concave portion of the data storage structure 55. The data line 105 may include a bit line.

The data line 105 may constitute part of a semiconductor phase-change memory device 110 along with a cell selection stud 20, a pad electrode 25, the data contact structure DCS, and the data storage structure 55.

FIGS. 12 through 16 are cross-sectional views taken along line I-I' of FIG. 1, which illustrate a method of fabricating a semiconductor phase-change memory device according to example embodiments. FIGS. 12 through 16 will use the same reference numeral to the same element as FIGS. 3 through 8. Also, processes that will be described below may be performed on the resultant structure shown in FIG. 3.

Figure 12:
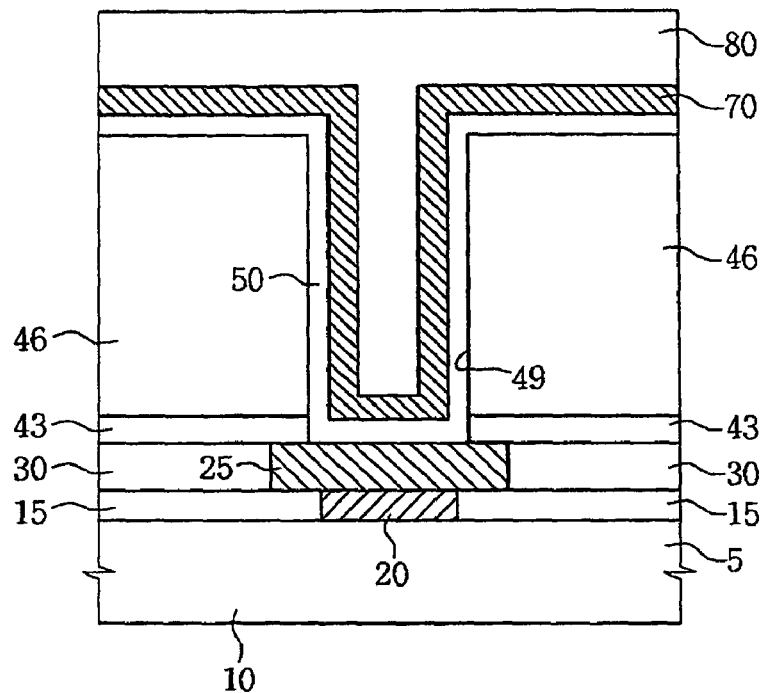
FIGS. 12 through 16 are cross-sectional views taken along line I-I' of FIG. 1, which illustrate a method of fabricating a semiconductor phase-change memory device according to example embodiments.

Referring to FIG. 12, third and fourth insulating layers 43 and 46 may be sequentially formed on the second insulating layer 30 to cover the pad electrode 25. An opening 49 may be formed through the third and fourth insulating layers 43 and 46. The opening 49 of the third and fourth insulating layers 43 and 46 may be formed to expose the pad electrode 25. The third and fourth insulating layers 43 and 46 may constitute an upper insulating layer. A phase-change material layer 50, a protection layer 70, and a filling layer 80 may be sequentially formed on the third and fourth insulating layers 43 and 46.

The phase-change material layer 50, the protection layer 70, and the filling layer 80 may be formed by performing a semiconductor deposition process. The phase-change material layer 50 and the protection layer 70 may be formed to conformably cover the opening 49. The phase-change material layer 50 may comprise chalcogenide. The protection layer 70 may comprise conductive material having a different etch rate than that of the phase-change material layer 50. The protection layer 70 may comprise the same material as, or a different material from that of, the pad electrode 25. The protection layer 70 may comprise titanium nitride.

The filling layer 80 may be formed to fill the opening 49. The filling layer 80 may comprise insulating material having a different etch rate than that of the protection layer 70.

Figure 13:
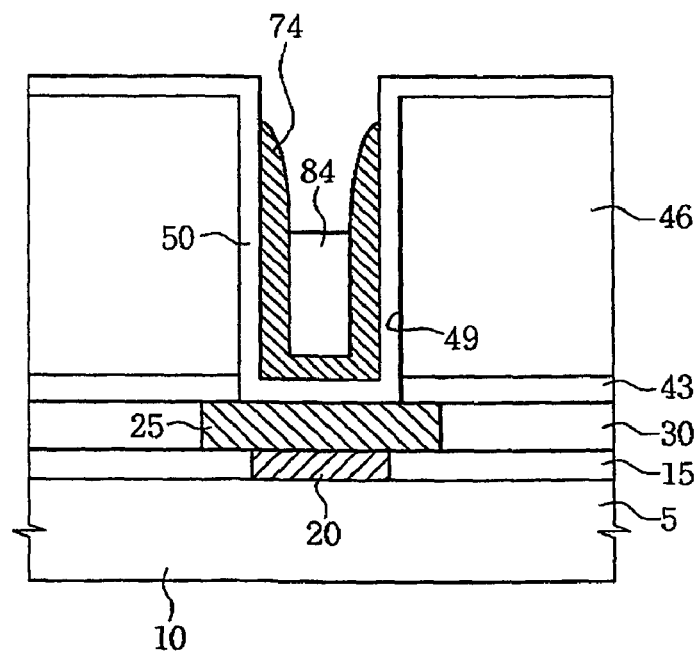

Referring to FIG. 13, the filling layer 80 and the protection layer 70 may be partially removed, thereby forming a preliminary protection pattern 74 and a preliminary filling pattern 84 in the opening 49. The preliminary protection pattern 74 and the preliminary filling pattern 84 may be formed by performing a semiconductor etching process. The preliminary protection pattern 74 may be formed to expose the phase-change material layer 50. Alternatively, the preliminary filling pattern 84 may be formed to expose the phase-change material layer 50 and the preliminary protection pattern 74.

The preliminary protection pattern 74 and the preliminary filling pattern 84 may be disposed in a central region of the opening 49 to protect the phase-change material layer 50 at least disposed on a bottom surface of the opening 49.

Figure 14:
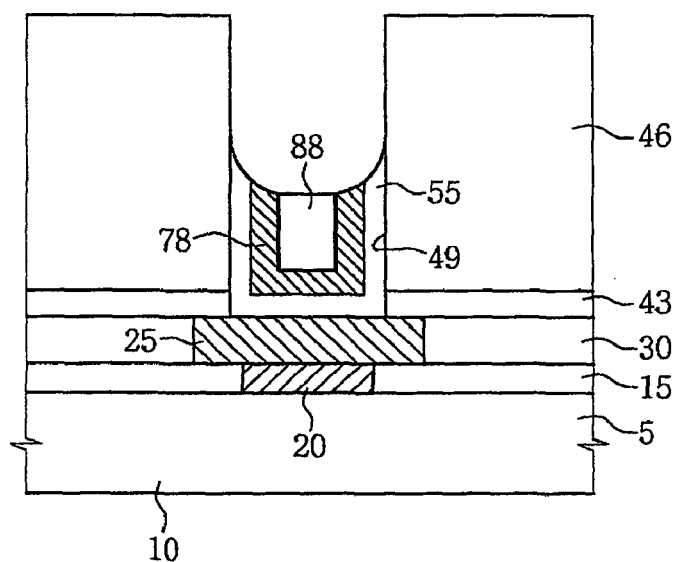
Figure 15:
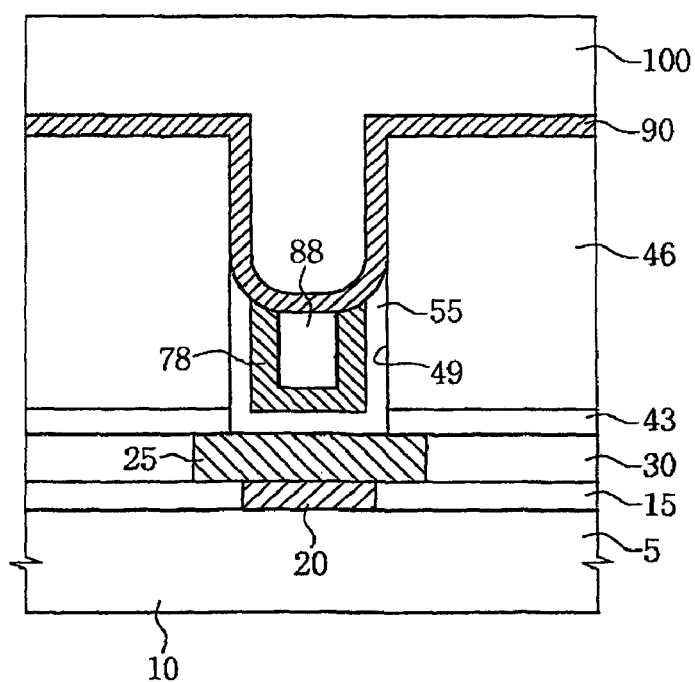

Referring to FIGS. 14 and 15, the phase-change material layer 50, the preliminary protection pattern 74, and the preliminary filling pattern 84 may be partially removed, thereby forming a data storage structure 55, a protection pattern 78, and a filling pattern 88 in the opening 49 as shown in FIG. 14. The data storage structure 55, the protection pattern 78, and the filling pattern 88 may be formed by performing a semiconductor etching process. The data storage structure 55, the protection pattern 78, and the filling pattern 88 may expose a top surface of the upper insulating layer 43 and 46 and an upper sidewall of the opening 49.

In this case, the data storage structure 55 may be formed to have a concave portion. The protection pattern 78 and the filling pattern 88 may be formed to fill the concave portion of the data storage structure 55. A contact layer 90 may be formed to cover the upper insulating layer 43 and 46, the data storage structure 55, the protection pattern 78, and the filling pattern 88 as shown in FIG. 15. The contact layer 90 may comprise the same material as, or a different material from that of, the pad electrode 25.

The contact layer 90 may comprise the same material as, or a different material from that of, the protection pattern 78. The contact layer 90 may conformably cover the upper sidewall of the opening 49. A conductive layer 100 may be formed on the contact layer 90 as shown in FIG. 15. The conductive layer 100 may be formed to fill the opening 49. The contact layer 90 and the conductive layer 100 may be formed by performing a semiconductor deposition process.

Figure 16:
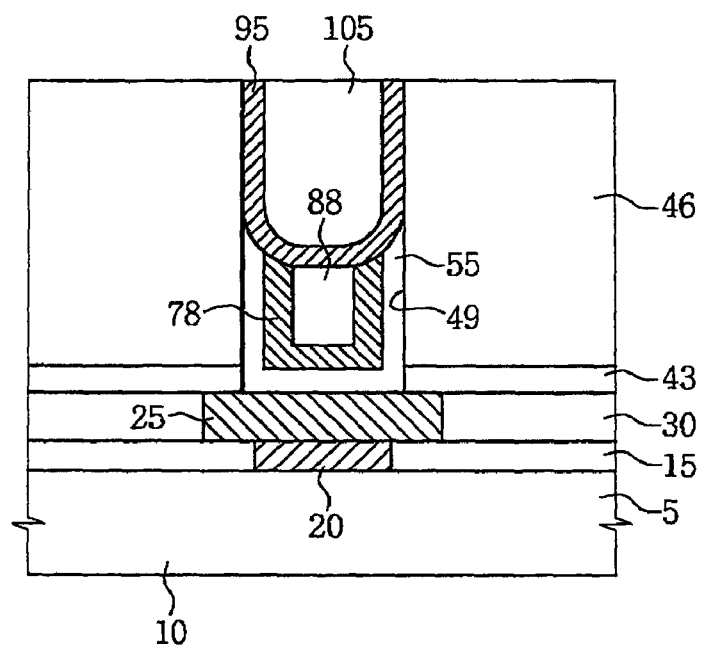

Referring to FIG. 16, the conductive layer 100 and the contact layer 90 may be partially removed, thereby forming a contact pattern 95 and a data line 105. The contact pattern 95 and the data line 105 may be formed by performing a semiconductor etching process. The contact pattern 95 may constitute a data contact structure DCS along with the protection pattern 78 and the filling pattern 88. Thus, the contact pattern 95 may form an upper portion of the data contact structure DCS, while the protection pattern 78 and the filling pattern 88 may form a lower portion of DCS.

In this case, the data contact structure DCS may have conductive materials in the upper and lower portions using the protection pattern 78 and the contact pattern 95. The protection pattern 78 and the contact pattern 95 may be formed along the opening 49 to define the filling pattern 88. The data line 105 may constitute a semiconductor phase-change memory device 110 along with a cell selection stud 20, the pad electrode 25, the data contact structure DCS, and the data storage structure 55.

Figure 17:
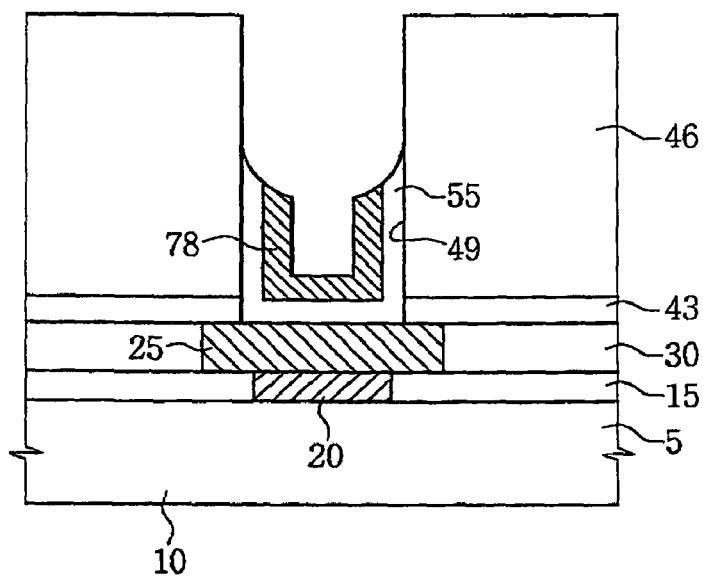
FIGS. 17 through 19 are cross-sectional views taken along line I-I' of FIG. 1, which illustrate a method of fabricating a semiconductor phase-change memory device according to example embodiments.
Figure 18:
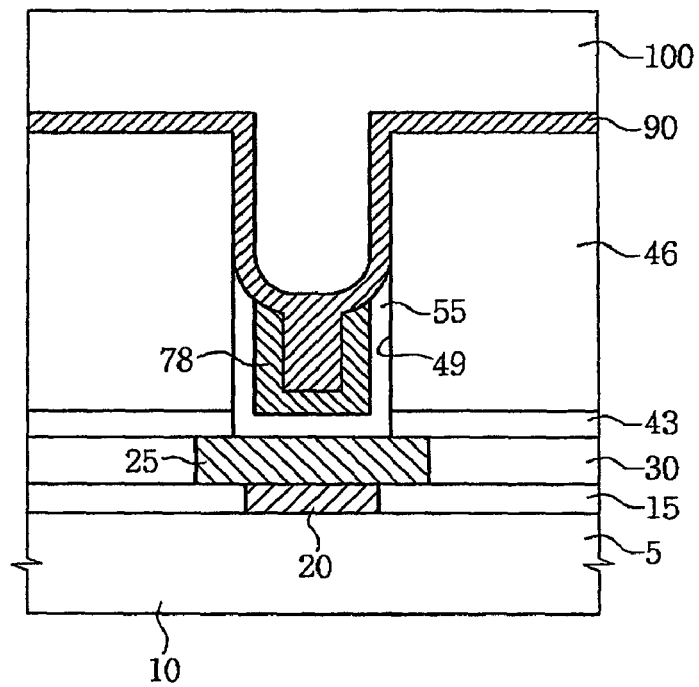
Figure 19:
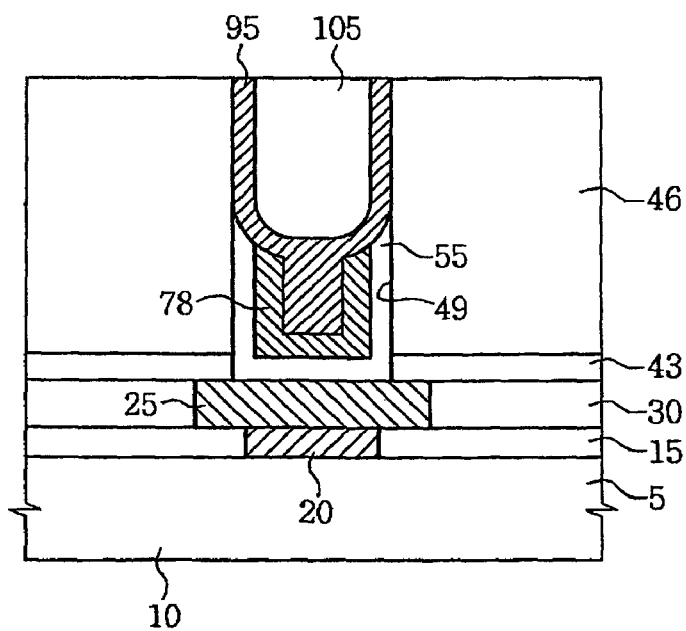

FIGS. 17 through 19 are cross-sectional views taken along line I-I' of FIG. 1, which illustrate a method of fabricating a semiconductor phase-change memory device according to example embodiments. FIGS. 17 through 19 will use the same reference numerals for the same elements as FIGS. 3 through 8. Also, processes that will be described below may be performed on the resultant structure shown in FIG. 14.

Referring to FIGS. 17 and 18, the filling pattern 88 may be removed using the upper insulating layer 43 and 46, the data storage structure 55, and the protection pattern 78 as an etch buffer layer as shown in FIG. 17. The filling pattern 88 may be removed by performing of a semiconductor etching process. A contact layer 90 may be formed to cover the upper insulating layer 43 and 46, the data storage structure 55, and the protection pattern 78 as shown in FIG. 18.

The contact layer 90 may conformably cover an upper sidewall of an opening 49. Also, the contact layer 90 may be formed to fill a concave portion of the data storage structure 55. A conductive layer 100 may be formed on the contact layer 90 as shown in FIG. 18. The conductive layer 100 may be formed to fill the opening 49.

Referring to FIG. 19, the conductive layer 100 and the contact layer 90 may be partially removed, thereby forming a contact pattern 95 and a data line 105 in the opening 49. The contact pattern 95 may constitute a data contact structure DCS along with the protection pattern 78. Thus, a portion of the contact pattern 95 may form an upper portion of the data contact structure DCS, while the protection pattern 78 and the remaining portion of the contact pattern 95 may form a lower portion of DCS. The remaining portion of the contact pattern 95 may fill the concave portion of the data storage structure 55.

The data line 105 may constitute a semiconductor phase-change memory device 110 along with a cell selection stud 20, a pad electrode 25, the data contact structure DCS, and the data storage structure 55.

As described above, example embodiments provide a semiconductor phase-change memory device including a data storage structure, a data contact structure, and a data line that are sequentially stacked in an insulating layer. To do this, the insulating layer is formed to have an opening. The opening of the insulating layer may be filled with the data storage structure, the data contact structure, and the data line using semiconductor deposition and etching processes. As a result, the opening of the insulating layer may allow the data storage structure, the data contact structure, and the data line to be self-aligned with one another. Therefore, unlike in conventional cases, the data storage structure, the data contact structure, and the data line may be disposed in the semiconductor phase-change memory device without the need for performing a semiconductor photolithography process.

While example embodiments have been disclosed herein, it should be understood that other variations may be possible. Such variations are not to be regarded as a departure from the spirit and scope of example embodiments of the present application, and all such modifications as would be obvious to one skilled in the art are intended to be included within the scope of the following claims.

What is claimed is:

1. A semiconductor phase-change memory device comprising:
    a data line disposed on a semiconductor substrate;
    a data storage structure disposed under the data line and having a concave portion extending in a direction along the data line; and
    a data contact structure configured to contact the data storage structure, and having a lower portion filling the concave portion of the data storage structure and an upper portion surrounding at least a lower portion of the data line,
    wherein each of sidewalls of the data storage structure is disposed at substantially the same plane as a corresponding one of sidewalls of the upper portion of the data contact structure.

2. The device of claim 1 wherein a longitudinal axis of the data storage structure extending in the direction along the data line and a longitudinal axis of the data line are aligned at a central region of the data storage structure.

3. The device of claim 2, wherein the concave portion of the data storage structure is aligned with the longitudinal axis of the data storage structure.

4. The device of claim 1, wherein the lower portion of the data contact structure comprises insulating materials that are sequentially stacked and have different etch rates, and the upper portion of the data contact structure comprises conductive material.

5. The device of claim 1, wherein the lower portion of the data contact structure comprises insulating material and conductive material that are sequentially stacked and have different etch rates, and the upper portion of the data contact structure comprises the conductive material.

6. The device of claim 1, wherein the lower portion of the data contact structure comprises first conductive material and insulating material that are sequentially stacked and have different etch rates, the upper portion of the data contact structure comprises second conductive material, and the first and second conductive materials comprise one of the same material and different materials.

7. The device of claim 1, wherein the lower portion of the data contact structure comprises first conductive material and second conductive material that are sequentially stacked and have different etch rates, the upper portion of the data contact structure comprises the second conductive material, and the first and second conductive materials comprise one of the same material and different materials.

8. The device of claim 1, further comprising:
an upper insulating layer configured to surround the data line, the data contact structure, and the data storage structure; and
a pad electrode disposed under the upper insulating layer in contact with the data storage structure and configured to extend from the sidewalls of the data storage structure,
wherein the pad electrode is disposed on the semiconductor substrate along the data storage structure.

9. The device of claim 8, wherein the upper insulating layer comprises at least one insulating material.

10. The device of claim 9, wherein the pad electrode comprises one of the same material as and a different material from the upper portion of the data contact structure.

11. The device of claim 10, further comprising:
a cell selection stud interposed between the pad electrode and the semiconductor substrate and electrically connected to the data line and the semiconductor substrate; and
a lower insulating layer configured to surround the pad electrode and the cell selection stud,
wherein the lower insulating layer comprises at least one insulating material, and the cell selection stud comprises at least two conductive materials.

* * * * *